United States Patent [19]

Kelkar et al.

[11] Patent Number: 5,680,076

[45] Date of Patent: Oct. 21, 1997

[54] PHASE-LOCK INDICATOR CIRCUIT WITH PHASE-ONLY DETECTION

[75] Inventors: Ram Kelkar, So. Burlington; Ilya Iosephovich Novof, Essex Junction, both of Vt.

[73] Assignee: International Business Machines Corporation, New York, N.Y.

[21] Appl. No.: 583,269

[22] Filed: Jan. 5, 1996

[51] Int. Cl.[6] ............................................. H03D 3/02
[52] U.S. Cl. ............................................. 331/25; 331/DIG. 2
[58] Field of Search ............................ 331/25, DIG. 2; 327/158, 160, 170

[56] References Cited

U.S. PATENT DOCUMENTS

| | | | |
|---|---|---|---|
| 4,388,598 | 6/1983 | Egan | 331/4 |
| 4,617,520 | 10/1986 | Levine | 331/4 |
| 4,668,917 | 5/1987 | Levine | 328/133 |
| 4,866,402 | 9/1989 | Black | 331/1 |
| 4,885,553 | 12/1989 | Hietala et al. | 331/17 |
| 5,220,295 | 6/1993 | Glover et al. | 331/25 |
| 5,256,989 | 10/1993 | Parker et al. | 331/1 |
| 5,304,952 | 4/1994 | Quiet et al. | 331/1 |
| 5,386,437 | 1/1995 | Yasuda | 375/120 |
| 5,483,558 | 1/1996 | Leon et al. | 375/376 |

*Primary Examiner*—Robert Pascal
*Assistant Examiner*—An T. Luu
*Attorney, Agent, or Firm*—Schmeiser, Olsen & Watts; William P. Skladony; Robert A. Walsh

[57] ABSTRACT

A phase-lock indicator circuit is disclosed that compares first and second clock signals and indicates when the signals are in-phase. The circuit includes a phase-only detector which is immune to frequency differences. The clock signals are compared by first extracting their leading edges and generating a first pulse signal when the leading edges occur simultaneously. Then, when a consecutive number of first pulse signals has occurred, a second pulse signal is generated, which in turn produces a lock indication signal, indicating that the first clock signal is in-phase with the second clock signal, regardless of whether or not the frequencies of the clock signals are equal. The lock circuit can be used in any PLL circuit regardless of the specific Phase Detector used. The circuit can also be used in any application or circuit where two clocks need to be tracked. In addition, the phase-lock detector includes a loss of input clock feature that indicates if the input clock is lost.

15 Claims, 3 Drawing Sheets

PHASE-LOCK INDICATOR CIRCUIT WITH PHASE-ONLY DETECTION

BACKGROUND OF THE INVENTION

1. Technical Field

The invention relates generally to phase-lock indicator circuits and, more specifically, to phase-lock indicator circuits with phase-only lock detection features.

2. Background Art

Many devices have a need for a circuit that tracks two clocks and provides an indication when the two are in phase. One example of such a circuit is the Phase-Lock Loop (PLL) circuit, which produces an output clock that operates substantially at the same frequency and phase as the input clock. PLL circuits are commonly used in timing applications such as clock generation, clock extraction and synchronizing chip-to-chip communications.

Lock detection circuitry is used with PLL circuits to indicate when the input and output clocks of the PLL circuit are in a locked position, that is, when the phase of an output signal matches the phase of an input signal. U.S. Pat. No. 5,304,952, "Lock Sensor Circuit and Method for Phase Lock Loop Circuits," (issued April 1994 to Quiet et al. and assigned to National Semiconductor, Corp.), which is incorporated by reference, discloses a lock detection circuit used in a PLL circuit. The PLL circuit includes a Phase Detector device that produces output up and down pulse signals from a reference signal and a feedback signal. The reference signal and the feedback signal are assumed to be at the same frequency to allow for the lock indicator circuit to work and to insure an in-phase condition. The number of successive high output up and down pulse signals are then counted to generate a lock/unlock detector signal. Consequently, because the frequency of the signals in this reference need to be basically equal before the phase can be locked into place, systems that only need phase alignment will have to wait longer while their frequencies align. Hence, the system's performance is degraded. Furthermore, using the signals from the Phase Detector in the PLL loop limits the lock detector circuit in that it works only with this specific PLL circuit.

Examples of other lock detection circuits may be found in the following United States Patents, which are hereby incorporated by reference: U.S. Pat. No. 4,388,598, "Loss-of-Phase-Lock Indicator Circuit," (issued June 1983 to Egan and assigned to USA/Navy); U.S. Pat. No. 4,617,520, "Digital Lock Detector for a Phase-Locked Loop," (issued October 1986 to Levine and assigned to Motorola, Inc.); U.S. Pat. No. 4,668,917, "Phase Comparator for Use with a Digital Phase Locked Loop or Other Phase Sensitive Device," (issued May 1987 to Levine and assigned to Motorola, Inc.); U.S. Pat. No. 4,866,402, "System to Verify Phase Lock of a Phase Lock Loop," (issued September 1989 to Black and assigned to TI, Inc.); U.S. Pat. No. 4,885,553, "Continuously Adaptive Phase Locked Loop Synthesizer," (issued December 1989 to Hietala et al. and assigned to Motorola, Inc.); and U.S. Pat. No. 5,256,989, "Lock Detection for a Phase Lock Loop," (issued October 1993 to Parker et al. and assigned to Motorola, Inc.).

Although the aforementioned patents provide a way to indicate when the PLL circuit is in phase, the frequencies of the clocks in the references have to be the same for the various circuits to operate. Thus, the circuits are input-frequency dependent and hence, are unreliable. Also, the signals from the Phase Detector in the PLL loop are needed for the aforementioned lock detector circuits, thus limiting each lock detector circuit to work only with its specific PLL circuit. Furthermore, when the signals from the PLL Phase Detector are used in the lock detector circuit design, an undesirable loading and/or noise level may affect the operation of the PLL circuit.

Accordingly, a need has developed in the art for a lock indicator circuit that is input-frequency independent, and can be used with any PLL circuit regardless of the specific Phase Detector used for that PLL circuit.

SUMMARY OF THE INVENTION

It is thus an advantage of the present invention to provide a circuit such as a PLL circuit with lock detection circuitry that indicates when two clock signals are in phase with each other even when the compared signals are at different frequencies.

It is a further advantage of the present invention to provide a lock detection circuit that is independent of Phase Detector signals used within a PLL loop, and only needs the compared clock signals for reliable indication of a locked condition.

It is yet a further advantage of the present invention to provide a lock detection circuit that is tolerant to small fluctuations in the phase.

The foregoing and other advantages of the invention are realized by a circuit for comparing two clock signals and indicating when the signals are in-phase. The circuit includes an input device, edge detect circuit, edge coincidence circuit, pattern repeatability circuit, and latch device.

The input device inputs a first clock signal having a first phase and a first frequency, and a second clock signal having a second phase and a second frequency. The edge detect circuit will then determine the leading edges of the first and second clock signals, and a first pulse signal is generated by the edge coincidence circuit when the leading edges of the first and second clock signals occur simultaneously. The pattern repeatability circuit, which is coupled to the edge coincidence circuit, generates a second pulse signal when a consecutive number of first pulse signals has occurred. This indicates that the first clock signal is in-phase with the second clock signal, regardless of whether or not the frequencies of the clock signals are equal. The latch device will then generate a lock indication signal when the second pulse signal has occurred.

Each lock indicator circuit can thus be used in any PLL circuit regardless of the specific Phase Detector used, and can also be used in any application where two clocks need to be tracked. The circuit is a standalone circuit in the sense that it contains all the necessary functions to detect the locked condition of two inputted clocks. It also operates reliably with a jitter-related phase difference between the two clocks, that is, a predetermined phase difference between the first and second clock signal will be considered in-phase when it is implemented into the circuitry as such. Thus, the amount of jitter-related tolerance for the circuit is adjustable.

In addition, the circuit in accordance with the present invention includes a loss of input clock feature that produces an indication if the input clock is lost.

BRIEF DESCRIPTION OF DRAWINGS

The foregoing and other features and advantages of the invention will be apparent from the following more particular description of the preferred embodiment(s) of the invention, as illustrated in the accompanying drawings.

DETAILED DESCRIPTION OF THE BEST MODE FOR CARRYING OUT THE INVENTION

Figure 1:
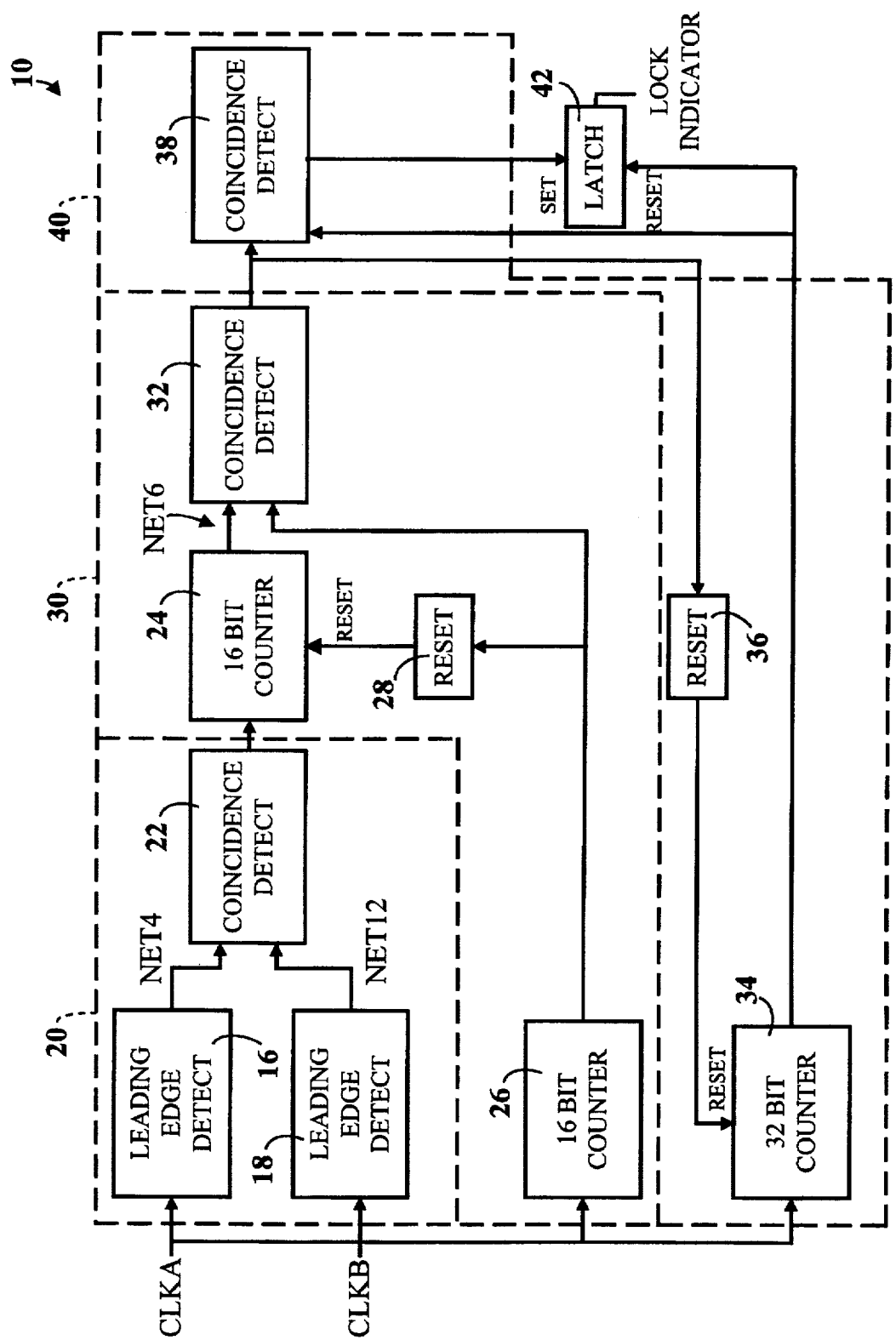
FIG. 1 is a block diagram illustrating a phase-lock indicator circuit in accordance with a preferred embodiment of the present invention.
Figure 3:
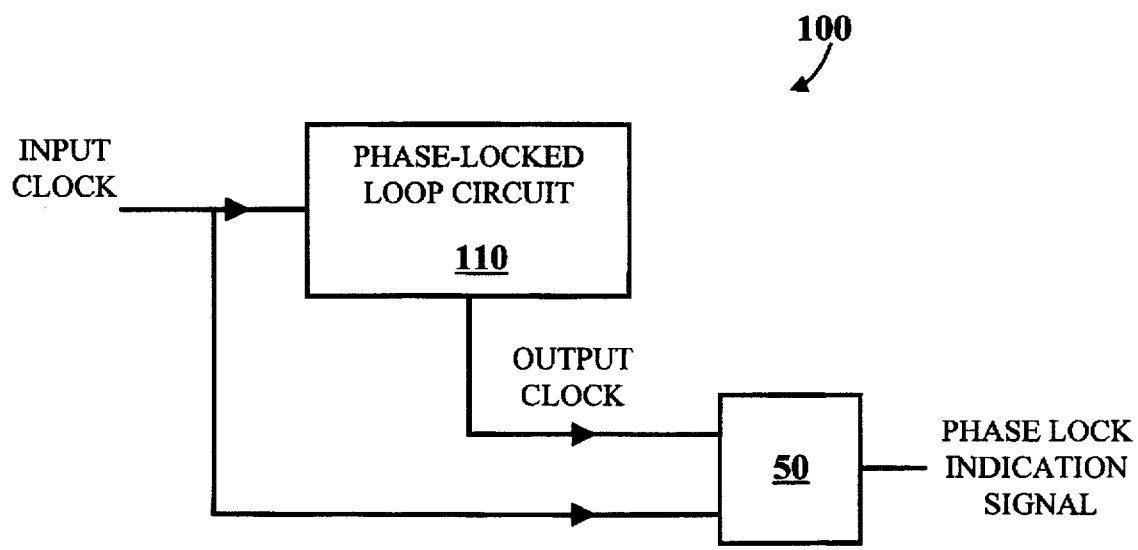
FIG. 3 is a block diagram illustrating the phase-lock indicator of FIG. 2 used in a PLL system.

With reference to FIG. 1, the block diagram 10 shows a preferred embodiment of the present invention. A first and a second clock signal, CLKA and CLKB, with a first and second phase and frequency, respectively, are input by an input device such as a clock circuit (e.g. PLL circuit as shown in FIG. 3), network, or any appropriate device into leading edge detect devices 16 and 18, respectively. The leading edges of CLKA and CLKB are then inputted into a first coincidence detect device 22, which indicates when the leading edges occur simultaneously. Elements 16, 18 and 22 make up the devices for determining edge coincidence 20.

The output of the coincidence detect device 22 is counted by a first 16-bit counter 24. The first counter 24 is reset by a second 16-bit counter 26, whose input is CLKA, through a reset device 28. The outputs of the first counter 24 and the second counter 26 are then inputted into a second coincidence detect device 32 to indicate a repetition in consecutive clock edges. Accordingly, elements 24, 26, 28 and 32 make up the devices for determining a pattern repeatability 30.

The output of the second coincidence detect device 32 is then compared with the output of a 32-bit counter 34 (with CLKA as its input) through a third coincidence detect device 38 to indicate if the pattern established previously is discontinued. The 32-bit counter 34 is reset by the output of the second coincidence detect device 32 through reset device 36. Elements 34, 36 and 38 make up the devices for determining pattern discontinuity 40.

The output of the third coincidence detect device 38 is then inputted into a latch 42, which will then indicate a phase lock for the two clocks CLKA and CLKB. The latch is reset by the 32-bit counter 34.

Figure 2:
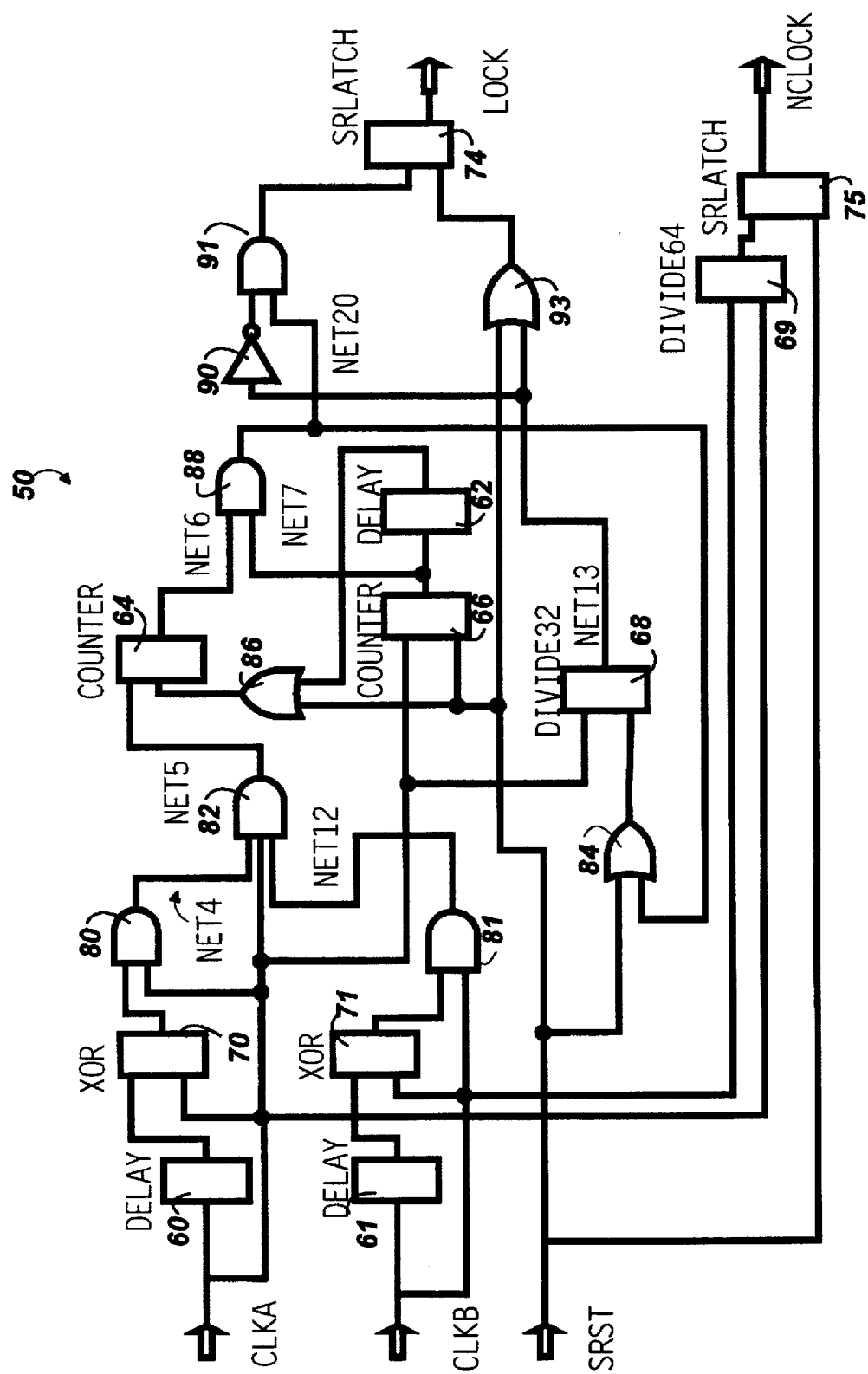
FIG. 2 is a schematic diagram illustrating the block diagram of FIG. 1.

As shown in FIG. 2, the details of the block diagram 10 of FIG. 1 are illustrated through the circuit diagram 50. The leading edges of CLKA and CLKB are extracted through first and second delay devices 60 and 61, first and second XOR devices 70 and 71, and AND gates 80 and 81, respectively (corresponding to elements 16 and 18 of FIG. 1). CLKA is an input to first delay device 60, the first XOR device 70 and AND gates 80 and 82. CLKB is an input to second delay device 61, the second XOR device 71 and AND gate 81. The first delay device 60 is coupled to the first XOR device 70, which in turn is an input to AND gate 80. The second delay device 61 is coupled to the second XOR device 71, which in turn is an input to AND gate 80.

The leading edge pulses of CLKA and CLKB at NET4 and NET12 are inputted and compared at AND gate 82. A count pulse is made available at NET5 to a first 16-bit pulse counter 64 only if the leading edges of the clocks occur simultaneous (i.e. are in phase). Although an AND gate 88 is shown to correspond with the coincidence detect 22 of FIG. 1, other similar devices, such as a latch or a variety of gates, may be used without departing from the scope of the invention.

Fifteen consecutive pulses at NET5 will cause the first pulse counter 64 to pulse at NET6. A second 16-bit pulse counter 66, which counts input clock (CLKA) signals only, is used to ensure the pulses are consecutive. If the outputs of the first and second pulse counters 64 and 66 pulse at the same time, the AND gate 88 (corresponding to element 32 of FIG. 1) will cause NET20 to pulse high. This means that for every 15 input clock signals there are an equal number of pulses at NET5, thus implying that the pulses are consecutive and the two clocks are in phase. NET20 will then set the output latch 74, which in turn will set the LOCK output HIGH.

The output of the pulse counter 66 resets, via delay device 62 and OR gate 86, the first counter 64 after sixteen input clock (CLKA) pulses. Hence, a check for an in-phase condition is made every sixteen input clock pulses. A system reset (SRST) input is also available to reset all the counters and latches.

The unlock counter 68 counts 32 pulses of the input clock, and is reset by the AND gate 88 if an in-phase condition is detected. Otherwise, the counter 68 resets the output latch 74 and pulls the LOCK output LOW. The counter 68, inverter 90 and AND gate 91 correspond to elements 34 and 38 of FIG. 1. As aforementioned, a latch or similar device or combination thereof may be used in place of any or all AND gates described without departing from the scope of the invention. Similarly, an AND gate or any appropriate combination of gates may be used for a latch device.

The loss of input clock condition is detected by the 64-bit pulse counter 69, which is reset by CLKA. Loss of CLKA causes the counter to complete its count, set the output latch 75, which then pulls the NCLOCK output LOW. The choice of a 64 pulse counter is dictated by the maximum frequency difference between the first and second clocks (e.g. the first clock is 5 MHz minimum and second clock is 250 MHz maximum, creating a 245 MHz frequency difference).

As shown in FIG. 3, the phase-lock indicator 50 is used with a PLL circuit 110 in a PLL system 100. When using the phase-lock indicator circuit 50 in conjunction with a PLL circuit 110, CLKA would normally be the input clock and CLKB the output clock. The PLL Phase Detector, which is part of the PLL circuit, would force the two clocks to be in-phase and of the same frequency. As soon as the phases of the two clocks are equal for a certain amount of pulses, the lock indicator will produce a lock indicator signal for the PLL circuit. Thus, the lock indicator signal indicates the availability of the output clock, that is, is signals the system that the output clock is now usable. The lock indicator signal can also be used for test purposes to confirm the PLL operation by initiated output phase and/or frequency sampling.

The circuit in accordance with the present invention allows the detection of a locked condition which is defined as when two clocks are in phase. The circuit is a stand-alone circuit in the sense that it contains all the necessary functions to detect this locked condition. It also operates reliably with a jitter-related phase difference between the two clocks, that is, a predetermined phase difference between the first and second clock signal will be considered in-phase when it is implemented into the circuitry as such. Thus, by changing the delay circuitry, the amount of jitter-related tolerance for the circuit is adjustable. An adjustable difference between the lock and unlock counters ensures reliable operation for periodic phase differences, which can occur during normal operation and are corrected by the PLL Phase Detector.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A lock detection circuit, comprising:
   input means for inputting a first clock signal having a first phase and a first frequency, and a second clock signal having a second phase and a second frequency;
   phase lock indicator means, coupled to said input means, for generating a phase lock indication signal when said first phase is equal to said second phase regardless of whether said first frequency is equal to or different from said second frequency; and
   a loss-of-input clock means, coupled to said first clock signal, for generating a no-clock signal when said first clock signal is absent.

2. The lock detection circuit of claim 1, wherein said phase lock indicator means further comprises:
   edge detect means, coupled to said input means, for determining leading edges of said first and second clock signals;
   edge coincidence means, coupled to said edge detect means, for generating a first pulse signal when said leading edges of said first and second clock signals occur simultaneously;
   pattern repeatability means, coupled to said edge coincidence means, for generating a second pulse signal when a consecutive number of said first pulse signal has occurred, indicating said first clock signal to be in-phase with said second clock signal; and
   latch means, coupled to said pattern repeatability means, for generating a lock indication signal when said second pulse signal has occurred.

3. The circuit of claim 2, further comprising:
   pattern discontinuity means, coupled to said pattern repeatability means and said latch means, for resetting said latch means when said first phase of said first clock signal is different than said second phase of said second clock signal.

4. The circuit of claim 2, wherein said pattern repeatability means comprises:
   a first counter, coupled to said edge coincidence means, for counting said first pulse signal to a number;
   a second counter, coupled to said first clock signal and said first counter, for counting said first clock signal to said number and resetting said first counter when said first clock signal reaches said number faster than said first pulse signal; and
   a coincidence detect circuit, coupled to said first and second counter, for outputting said second pulse signal when said first pulse signal reaches said number at the same time as said first clock signal, indicating said first clock signal to be in-phase with said second clock signal.

5. The circuit of claim 1, wherein said phase indicator means is adjustable for tolerating a predetermined phase difference between said first and second clock signal.

6. A method for indicating when a first phase of a first clock signal is equal to a second phase of a second clock signal comprising the steps of:
   a) inputting said first clock signal having said first phase and a first frequency;
   b) inputting said second clock signal having said second phase and a second frequency;
   c) generating a phase lock indication signal when said first phase is equal to said second phase regardless of whether said first frequency is equal to or different from said second frequency; and
   d) generating a no-clock signal when said first clock signal is absent.

7. The method of claim 6, wherein said generating step further comprises the steps of:
   c1) determining leading edges of said first and second clock signals;
   c2) generating a first pulse signal when said leading edges of said first and second clock signals occur simultaneously;
   c3) generating a second pulse signal when a consecutive number of said first pulse signal has occurred, indicating said first clock signal to be in-phase with said second clock signal; and
   c4) generating said phase lock indication signal when said second pulse signal has occurred.

8. The method of claim 7, further comprising the steps of:
   c5) resetting said phase lock indication signal to low when said first phase of said first clock signal is different than said second phase of said second clock signal.

9. The method of claim 7, wherein said generating a first pulse signal comprises the steps of:
   ca) counting said first pulse signal to a number on a first counter;
   cb) counting said first clock signal to said number;
   cc) resetting said first counter when said first clock signal reaches said number faster than said first pulse signal
   cd) outputting said second pulse signal when said first pulse signal reaches said number at the same time as said first clock signal, indicating said first clock signal to be in-phase with said second clock signal.

10. The method of claim 6, further comprising the step of:
    adjusting a phase indicator means for tolerating a predetermined phase difference between said first and second clock signal.

11. A phase-clock loop system having a lock detection circuit, said system comprising:
    a phase-lock loop circuit for generating an output clock signal from an inputted input clock signal;
    input means for inputting said input clock signal having a first phase and a first frequency, and said output clock signal having a second phase and a second frequency;
    phase lock indicator means, coupled to said input means, for generating a phase lock indication signal when said first phase is equal to said second phase regardless of whether said first frequency is equal to or different from said second frequency; and
    a loss-of-input clock means, coupled to said input clock signal, for generating a no-clock signal when said input clock signal is absent.

12. The system of claim 11, wherein said phase lock indicator means further comprises:
    edge detect means, coupled to said input means, for determining leading edges of said input and output clock signals;
    edge coincidence means, coupled to said edge detect means, for generating a first pulse signal when said leading edges of said input and output clock signals occur simultaneously;

pattern repeatability means, coupled to said edge coincidence means, for generating a second pulse signal when a consecutive number of said first pulse signal has occurred, indicating said input clock signal to be in-phase with said output clock signal; and latch means, coupled to said pattern repeatability means, for generating a lock indication signal when said second pulse signal has occurred.

13. The system of claim 12, further comprising:

pattern discontinuity means, coupled to said pattern repeatability means and said latch means, for resetting said latch means when said first phase of said input clock signal is different than said second phase of said output clock signal.

14. The system of claim 12, wherein said pattern repeatability means comprises:

a first counter, coupled to said edge coincidence means, for counting said first pulse signal to a number;

a second counter, coupled to said input clock signal and said first counter, for counting said input clock signal to said number and resetting said first counter when said input clock signal reaches said number faster than said first pulse signal; and a coincidence detect circuit, coupled to said first and second counter, for outputting said second pulse signal when said first pulse signal reaches said number at the same time as said input clock signal, indicating said input clock signal to be in-phase with said output clock signal.

15. The system of claim 11, wherein said phase indicator means is adjustable for tolerating a predetermined phase difference between said first and second clock signal.

* * * * *